US009172048B2

(12) United States Patent
Yoshimoto et al.

(10) Patent No.: US 9,172,048 B2
(45) Date of Patent: *Oct. 27, 2015

(54) CHARGE-TRANSPORTING VARNISH

(75) Inventors: Takuji Yoshimoto, Funabashi (JP); Go Ono, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 991 days.

This patent is subject to a terminal disclaimer.

(21) Appl. No.: 10/534,042

(22) PCT Filed: Nov. 6, 2003

(86) PCT No.: PCT/JP03/14145
§ 371 (c)(1),
(2), (4) Date: Nov. 15, 2005

(87) PCT Pub. No.: WO2004/043117
PCT Pub. Date: May 21, 2004

(65) Prior Publication Data

US 2006/0115652 A1    Jun. 1, 2006

(30) Foreign Application Priority Data

Nov. 7, 2002    (JP) ................................. 2002-323871

(51) Int. Cl.
| | |
|---|---|
| *H01B 1/12* | (2006.01) |
| *H01L 51/00* | (2006.01) |
| *C08G 73/02* | (2006.01) |
| *C09D 5/24* | (2006.01) |
| *C09D 179/02* | (2006.01) |
| *H05B 33/22* | (2006.01) |
| *H01L 51/50* | (2006.01) |

(52) U.S. Cl.
CPC ........ *H01L 51/0068* (2013.01); *C08G 73/0266* (2013.01); *C09D 5/24* (2013.01); *C09D 179/02* (2013.01); *H01B 1/12* (2013.01); *H05B 33/22* (2013.01); *H01L 51/0078* (2013.01); *H01L 51/5048* (2013.01); *H01L 51/5088* (2013.01); *Y02E 10/549* (2013.01); *Y10T 428/31504* (2015.04)

(58) Field of Classification Search
USPC ........ 252/500, 301.16–301.35; 428/690, 917; 427/58, 66; 313/502–509; 257/40, 257/88–103, E51.001–E51.052
See application file for complete search history.

(56) References Cited

U.S. PATENT DOCUMENTS

| | | |
|---|---|---|
| 5,264,552 A | 11/1993 | Abe et al. |
| 5,536,588 A | 7/1996 | Naito |
| 5,811,834 A | 9/1998 | Tamano et al. |
| 5,958,637 A | 9/1999 | Morishita et al. |
| 5,981,695 A | 11/1999 | Mattes et al. |
| 5,993,694 A * | 11/1999 | Ito et al. ........................ 252/500 |
| 6,160,177 A | 12/2000 | MacDiarmid et al. |
| 6,235,871 B1 | 5/2001 | Singer et al. |
| 6,358,437 B1 | 3/2002 | Jonas et al. |
| 6,582,504 B1 | 6/2003 | Fujita |
| 6,630,567 B1 * | 10/2003 | Palaniappan et al. ......... 528/422 |
| 6,720,029 B2 * | 4/2004 | Fujita et al. .................... 427/157 |
| 7,048,874 B2 * | 5/2006 | Louwet et al. ................. 252/500 |
| 7,341,678 B2 * | 3/2008 | Kato et al. ..................... 252/500 |
| 8,575,392 B2 * | 11/2013 | Yoshimoto et al. ........... 564/305 |
| 2001/0003602 A1 | 6/2001 | Fujita |
| 2004/0144975 A1 | 7/2004 | Seki et al. |
| 2005/0082514 A1 | 4/2005 | Yoshimoto et al. |
| 2006/0115652 A1 | 6/2006 | Yoshimoto et al. |
| 2006/0225611 A1 | 10/2006 | Kato et al. |
| 2007/0043222 A1 * | 2/2007 | Yoshimoto et al. ............. 549/15 |
| 2012/0263867 A1 | 10/2012 | Kanbe et al. |

FOREIGN PATENT DOCUMENTS

| | | |
|---|---|---|
| EP | 0361429 A2 | 4/1990 |
| EP | 0982974 A1 | 3/2000 |
| EP | 1083775 A1 | 3/2001 |
| EP | 1156072 A1 | 11/2001 |
| EP | 1477993 A1 | 11/2004 |
| EP | 1589788 A1 | 10/2005 |
| EP | 1638372 A1 | 3/2006 |
| EP | 1640372 A1 | 3/2006 |
| JP | 3-28229 A | 2/1991 |
| JP | 04-304465 * | 10/1992 |
| JP | 6-32878 A | 2/1994 |

(Continued)

OTHER PUBLICATIONS

Flick (ed), "Industrial Solvents Handbook," 5th Edition, William Andrew Publishing/Noyes, p. 367, 1998.*

(Continued)

*Primary Examiner* — Marie R. Yamnitzky
(74) *Attorney, Agent, or Firm* — Birch, Stewart, Kolasch & Birch, LLP

(57) ABSTRACT

A varnish containing a charge-transporting organic material and a solvent is used as a charge-transporting varnish. The charge-transporting organic material is composed of a charge-transporting substance comprising a charge-transporting monomer, or charge-transporting oligomer or polymer having a number average molecular weight of 200 to 500,000, or is composed of such a charge-transporting substance and an electron- or hole-accepting dopant substance. The solvent contains at least one type of high-viscosity solvent having a viscosity of 10 to 200 mPa·s at 20° C. The charge-transporting substance or the charge-transporting organic material is dissolved or uniformly dispersed in the solvent. The varnish has a high uniform film forming capability even in a system using a charge-transporting substance of low molecular weight and a charge-accepting dopant substance. When the varnish is used in, particularly an OLED device or PLED device, excellent EL device characteristics, namely a low drive voltage, a high luminance efficiency, and a long life are realized.

10 Claims, No Drawings

(56) References Cited

FOREIGN PATENT DOCUMENTS

| | | | |
|---|---|---|---|
| JP | 6-122277 | A | 5/1994 |
| JP | 2000-106278 | A | 4/2000 |
| JP | 2000-204158 | A | 7/2000 |
| JP | 2001-52861 | A | 2/2001 |
| JP | 2001-155861 | A | 6/2001 |
| JP | 2001-167878 | A | 6/2001 |
| JP | 2002-500408 | A | 1/2002 |
| JP | 2002-151272 | A | 5/2002 |
| JP | 2004-95406 | A | 3/2004 |
| JP | 2004-127897 | A | 4/2004 |
| JP | 2005-108828 | A | 4/2005 |
| WO | WO 99/28290 | A1 | 6/1999 |
| WO | WO-99/34371 | A1 | 7/1999 |
| WO | WO 00/59267 | A1 | 10/2000 |
| WO | WO 03/071559 | A1 | 8/2003 |
| WO | WO 03/080708 | A1 | 10/2003 |
| WO | WO 2004/043117 | A1 | 5/2004 |
| WO | WO 2004/105446 | A1 | 12/2004 |

OTHER PUBLICATIONS

Machine Translation of JP 04-304465, Oct. 1992.*
Machine Translation of JP 2002-151272, (May 2002).*
Nakayama et al., Heterocycles, vol. 26, No. 4, Apr. 1, 1987, pp. 939-942.
Van Slyke et al., Applied Physics Letters, vol. 69, No. 15, US, Oct. 7, 1996, pp. 2160-2162.
Gustafsson et al., Nature, vol. 357, UK, Jun. 11, 1992, pp. 477-479.
Yang et al., Applied Physics Letters, vol. 64, No. 10, US, Mar. 7, 1994, pp. 1245-1247.
Bharathan et al., Applied Physics Letters, vol. 72, No. 21, US, May 25, 1998, pp. 2660-2662.
Wakimoto et al., IEEE Transactions on Electron Devices, vol. 44, No. 8, US, Aug. 1997, pp. 1245-1248.
Hung et al., Applied Physics Letters, vol. 70, No. 2, US, Jan. 13, 1997, pp. 152-154.
Ganorig et al., Japanese Journal of Applied Physics, vol. 38, 1999, pp. L1348-L1350.
Ochi et al., Chemical Society of Japan, vol. 67, No. 6, 1994, pp. 1749-1752.
Zhang et al., Synthetic Metals, vol. 84, US, 1997, pp. 119-120.
Nakayama et al., Heterocycles, vol. 26, No. 7, 1987, pp. 1793-1796.
Supplementary European Search Report dated Sep. 4, 2009, for Application No. 05736641.1.
U.S. Office Action dated Oct. 25, 2012 for U.S. Appl. No. 11/579,066.
U.S. Office Action dated Jan. 15, 2009, for U.S. Appl. No. 11/579,066.
U.S. Office Action dated Jul. 5, 2012, for U.S. Appl. No. 11/579,066.
U.S. Office Action dated May 18, 2012, for U.S. Appl. No. 11/579,066.
U.S. Advisory Action, dated Jan. 20, 2010, for U.S. Appl. No. 11/579,066.
U.S. Office Action, dated Nov. 29, 2013, for U.S. Appl. No. 11/579,066.
U.S. Office Action, dated Oct. 2, 2009, for U.S. Appl. No. 11/579,066.
Supplementary European Search Report, dated Jan. 7, 2010, for EP 03810626.
US Office Action from copending U.S. Appl. No. 11/579,066 dated Aug. 11, 2014.
US Office Action from copending U.S. Appl. no. 11/579,066 dated Jun. 16, 2015.

* cited by examiner

CHARGE-TRANSPORTING VARNISH

TECHNICAL FIELD

The present invention relates to a charge-transporting varnish and its products in the form of charge-transporting thin film, organic electroluminescence (abbreviated as organic EL hereinafter) element, and solar cell.

BACKGROUND ART

Organic EL elements are broadly classified into low weight molecular type organic EL (OLED for short hereinafter) elements and polymer type organic EL (PLED for short hereinafter) elements.

It has been reported that an OLED element is improved in initial characteristic properties (such as low drive voltage and high luminous efficiency) and life if it is provided with a copper phthalocyanine (CuPC) layer as the hole injection layer. (Refer to Non-Patent Document 1: Applied Physics Letters, US, 1996, vol. 69, pp. 2160-2162)

It has been reported that a PLED element is also improved as in the case of OLED mentioned above if it is provided with a hole transporting layer (buffer layer) made from a polyaniline type material or a polythiophene type material. (For the former, refer to Non-Patent Document 2: Nature, UK, 1992, vol. 357, pp. 477-479, and Non-Patent Document 3: Applied Physics Letters, US, 1994, vol. 64, pp. 1245-1247. For the latter, refer to Non-Patent Document 4: Applied Physics Letters, US, 1998, vol. 72, pp. 2660-2662)

It has been reported that an organic EL element is improved in initial characteristic properties if it is provided (at its cathode side) with an electron injection layer made from any of the following materials. Metal oxide (refer to Non-Patent Document 5: IEEE Transaction on Electron Devices, US, 1997, vol. 44, pp. 1245-1248); metal halide (refer to Non-Patent Document 6: Applied Physics Letters, US, 1997, vol. 70, pp. 152-154); metal complex (refer to Non-Patent Document 7: Japanese Journal of Applied Physics, 1999, vol. 38, pp. 1348-1350)

The hole injection material for OLED elements is mostly a material for deposition. The disadvantage of a material for deposition is that it should meet several requirements. For example, it should be an amorphous solid, it should be sublimable, it should have good heat resistance, and it should have an adequate ionization potential ($I_p$ for short hereinafter). This disadvantage narrows the range of choice for materials for deposition. Another disadvantage of a material for deposition is difficulties with electrically doping. The disadvantage prevents a material for deposition from exhibiting a high charge transporting performance. The result is that the charge injection efficiency remains low. CuPC as a commonly used hole injection material has a highly irregular shape and adversely affects the characteristic properties even when a very small quantity of it enters the other organic layer.

The hole transporting material for PLED elements should meet such requirements as high charge transporting performance, insolubility in a solvent for luminous polymer such as toluene, and adequate $I_p$. Polyaniline type material and polythiophene type material, which are commonly used at present, suffer several disadvantages as follows. They contain water as a solvent which might accelerate degradation of elements. They have a limited range of choice for solvents because of their low solubility. They are liable to aggregation. They are restricted in methods for forming uniform film.

Meanwhile, there has recently been found a charge transporting varnish (in the form of organic solution) which contains a low-molecular-weight oligoaniline type material as the charge-transporting substance. It has been reported that an organic EL element exhibits outstanding characteristic properties if it is provided with a hole injection layer made from the charge transporting varnish. (Refer to patent document 1: JP 2002-151272A.)

However, the charge-transporting varnish containing the low-molecular-weight charge-transporting substance (which may be incorporated with a charge accepting dopant substance) presents difficulties in forming a highly flat film. In addition, it usually has a low viscosity because the charge-transporting substance has a low molecular weight and hence a low viscosity. The varnish with a low viscosity presents difficulties in various coating process by printing, ink-jet spraying, and the like.

A common way to adjust the viscosity of varnish is by changing the molecular weight of the material or incorporating the material with a thickening agent.

However, change in the molecular weight of the charge-transporting material is accompanied by a great change in physical properties, such as charge transporting performance, $I_p$, solubility, and morphology. Thus it is difficult to adjust the viscosity without changing other physical properties. On the other hand, incorporation with a thickening agent tends to deteriorate the charge transporting performance.

For reasons mentioned above, it is difficult to adequately adjust the viscosity of the varnish while maintaining other properties such as charge transporting performance.

The present invention was completed in view of the foregoing. It is an object of the present invention to provide an improved charge-transporting varnish and its products in the form of charge-transporting thin film, organic EL element, and solar cell. The above-mentioned charge-transporting varnish exhibits highly uniform film-forming performance even in the system containing a low-molecular-weight charge transporting substance and a charge accepting dopant substance. When used in an OLED element or a PLED element, it exhibits outstanding EL characteristics, such as low drive voltage, high luminous efficiency, and long life.

DISCLOSURE OF INVENTION

The inventors found that a varnish containing an organic charge-transporting substance, particularly an oligomeric one having a number-average molecular weight no higher than 5000, dissolved in a solvent tends to give rise to a film with surface irregularities due to aggregation after application and solvent evaporation, because it has a great intermolecular force due to π-π stacking effect and hence is poorer in dispersibility than polymeric materials having a sufficiently high molecular weight. On the basis of this finding, the present inventors carried out a series of researches to achieve the above-mentioned objective. As a result, it was found that a varnish containing a charge-transporting substance (or a charge-transporting organic material composed of a charge-transporting substance and a dopant) which is dissolved or uniformly dispersed in a high-viscosity solvent with a specific viscosity has a comparatively low flowability and prevents the material and solvent from aggregating due to solvent evaporation at the time of film formation. Thus, the varnish gives rise to a highly uniform thin film that can be used as the hole injection layer of organic EL elements. The resulting organic EL elements are found to have a low drive voltage, an improved luminous efficiency, and an extended life. These findings led to the present invention.

The present invention provides the following.

1. A charge-transporting varnish which comprises a charge-transporting substance composed of a charge-transporting monomer or a charge-transporting oligomer or polymer having a number-average molecular weight of 200 to 500,000, or a charge-transporting organic material composed of said charge-transporting substance and an electron accepting dopant substance or hole accepting dopant substance, and a solvent containing at least one species of high-viscosity solvent having a viscosity of 10 to 200 mPa·s at 20° C., said charge-transporting substance or charge-transporting organic material being dissolved or uniformly dispersed in said solvent.

2. A charge-transporting varnish as defined in paragraph 1 above, wherein said charge-transporting substance is a charge-transporting monomer having conjugated units or a charge-transporting oligomer with a number-average molecular weight of 200 to 5000 having conjugated units, said conjugated units being homogeneous and continuously arranged or being heterogeneous and randomly arranged.

3. A charge-transporting varnish as defined in paragraph 2 above, wherein said conjugated unit is at least one species selected from substituted or unsubstituted and di- to tetravalent aniline, thiophene, dithiin, furan, pyrrole, ethynylene, vinylene, phenylene, naphthalene, anthracene, imidazole, oxazole, oxadiazole, quinoline, quinoxaline, silole, silicone, pyridine, pyrimidine, pyrazine, phenylenevinylene, fluorene, carbazole, triarylamine, metal-containing or metal-free phthalocyanine, and metal-containing or metal-free porphyrin.

4. A charge-transporting varnish as defined in any of paragraphs 1 to 3 above, wherein said charge-transporting substance is an oligoaniline derivative represented by the formula (1) or a quinonediimine derivative which is an oxidized form of an oligoaniline derivative represented by the formula (1).

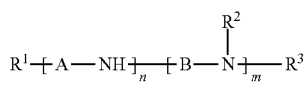

(1)

(where $R^1$, $R^2$, and $R^3$ independently denote hydrogen, hydroxyl group, halogen group, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group, and A and B independently denote a divalent group represented by the formula (2) or (3) below.

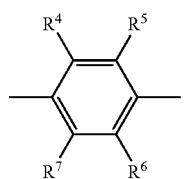

(2)

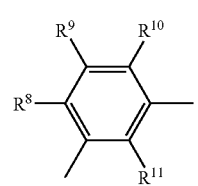

(3)

(where $R^4$ to $R^{11}$ independently denote hydrogen, hydroxyl group, halogen group, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group, and m and n independently denote an integer of 1 and above, such that $m+n \leq 20$.))

5. A charge-transporting varnish as defined in paragraph 1 or 2 above, wherein said charge-transporting substance is a 1,4-dithiin derivative represented by the formula (4).

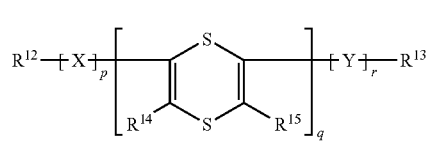

(4)

(where $R^{12}$, $R^{13}$, $R^{14}$, and $R^{15}$ independently denote hydrogen, hydroxyl group, halogen group, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group; X and Y each denote at least one species selected from substituted or unsubstituted, di- to tetra-valent aniline, thiophene, furan, pyrrole, ethynylene, vinylene, phenylene, naphthalene, anthracene, imidazole, oxazole, oxadiazole, quinoline, quinoxaline, silole, silicon, pyridine, pyrimidine, pyrazine, phenylenevinylene, fluorene, carbazole, triarylamine, metal-containing or metal-free phthalocyanine, and metal-containing or metal-free porphyrin; the dithiin ring may be dithiinoxide ring or dithiindioxide ring; and p, q, and r independently denote 0 or an integer of 1 and above, such that $p+q+r \leq 20$.)

6. A charge-transporting varnish as defined in any of paragraphs 1 to 5 above, wherein said electron accepting dopant substance is a sulfonic acid derivative represented by the formula (5).

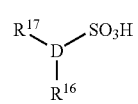

(5)

(where D denotes a benzene ring, naphthalene ring, anthracene ring, phenanthrene ring, or heterocyclic ring; and $R^{16}$ and $R^{17}$ independently denote a carboxyl group or hydroxyl group.)

7. A charge transporting thin film which is made from the charge transporting varnish defined in any of paragraphs 1 to 6 above.

8. An organic electroluminescent element which has the charge transporting thin film defined in paragraph 7.
9. An organic electroluminescent element as defined in paragraph 8, wherein said charge transporting thin film is a hole injection layer or a hole transporting layer.
10. A solar cell which is made with the charge transporting varnish defined in any of paragraphs 1 to 6 above.

The charge-transporting varnish according to the present invention has an adequate viscosity even when it is made from a low-molecular-weight charge transporting substance. Therefore, it is adaptable to various coating methods and baking methods. Moreover, it gives rise to a charge transporting thin film which is flat and highly uniform. The charge-transporting varnish may be made into a charge-transporting thin film as a hole injection layer for an organic EL element. The thus obtained hole injection layer contributes to reduced drive voltage, improved luminous efficiency, and extended life.

BEST MODE FOR CARRYING OUT THE INVENTION

The invention will be described below in more detail.

The charge-transporting varnish according to the present invention comprises a charge-transporting substance composed of a charge-transporting monomer or a charge-transporting oligomer or polymer having a number-average molecular weight of 200 to 500,000, or a charge-transporting organic material composed of the above-mentioned charge-transporting substance and an electron accepting dopant substance or hole accepting dopant substance, and a solvent containing at least one species of high-viscosity solvent having a viscosity of 10 to 200 mPa·s at 20° C., the charge-transporting substance or charge-transporting organic material being dissolved or uniformly dispersed in the solvent.

Here, the term "charge-transporting" is synonymous with "electrically conductive", and it implies any of hole-transporting, electron-transporting, and hole- and electron-transporting. The charge-transporting varnish according to the present invention may be the one which exhibits charge-transporting property by itself; it may also be the one which gives rise to a solid film which exhibits charge transporting property.

The charge-transporting substance according to the present invention is not specifically restricted so long as it is a charge-transporting monomer or a charge-transporting oligomer or polymer which is soluble or uniformly dispersible in a solvent. It should preferably be a charge-transporting monomer having conjugated units or a charge-transporting oligomer with a number-average molecular weight of 200 to 5000 having conjugated units, the conjugated units being homogeneous and continuously arranged or being heterogeneous and randomly arranged.

The conjugated units are not specifically restricted so long as they are atoms, aromatic rings, or conjugated groups capable of transporting charges. Considering high solubility in organic solvents and good charge-transporting performance, they should preferably be substituted or unsubstituted and di- to tetra-valent aniline, thiophene, dithiin, furan, pyrrole, ethynylene, vinylene, phenylene, naphthalene, anthracene, imidazole, oxazole, oxadiazole, quinoline, quinoxaline, silole, silicon, pyridine, pyrimidine, pyrazine, phenylenevinylene, fluorene, carbazole, triarylamine, metal-containing or metal-free phthalocyanine, and metal-containing or metal-free porphyrin. Incidentally, the conjugated units may join together to form a conjugated chain which may contain cyclic parts.

The substituent groups in the conjugated unit may be independently hydrogen, hydroxyl group, halogen group, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group. These functional groups may have any arbitrary functional groups.

In this case, the monovalent hydrocarbon group may be exemplified by alkyl groups (such as methyl group, ethyl group, propyl group, butyl group, t-butyl group, hexyl group, octyl group, and decyl group), cycloalkyl groups (such as cyclopentyl group and cyclohexyl group), bicycloalkyl groups (such as bicyclohexyl group), alkenyl groups (such as vinyl group, 1-propenyl group, 2-propenyl group, isopropenyl group, 1-methyl-2-propenyl group, 1-, 2-, or 3-butenyl group, and hexenyl group), aryl groups (such as phenyl group, xylyl group, tolyl group, biphenyl group, and naphthyl group), and aralkyl groups (such as benzyl group, phenylethyl group, and phenylcyclohexyl group). The monovalent hydrocarbon group may have its hydrogen atoms substituted partly or entirely by halogen atoms, hydroxyl groups, and/or alkoxyl group.

The organoxy group is exemplified by alkoxy group, alkenyloxy group, and aryloxy group. They are based on the same alkyl group, alkenyl group, and aryl group as mentioned above.

The organoamino group is exemplified by alkylamino groups (such as methylamino group, ethylamino group, propylamino group, butylamino group, pentylamino group, hexylamino group, heptylamino group, octylamiono group, nonylamino group, decylamino group, and laurylamino group), dialkylamino groups (such as dimethylamino group, diethylamino group, dipropylamino group, dibutylamino group, dipentylamino group, dihexylamino group, diheptylamino group, dioctylamino group, dinonylamino group, and didecylamino group), cyclohexylamino group, and morpholino group.

The organosilyl group is exemplified by trimethylsilyl group, triethylsilyl group, tripropylsilyl group, tributylsilyl group, tripentylsilyl group, trihexylsilyl group, pentyldimethylsilyl group, hexyldimethylsilyl group, octyldimethylsilyl group, and decyldimethylsilyl group.

The organothio group is exemplified by alkylthio groups such as methylthio group, ethylthio group, propylthio group, butylthio group, pentylthio group, hexylthio group, heptylthio group, octylthio group, nonylthio group, decylthio group, and laurylthio group.

The acyl group is exemplified by formyl group, acetyl group, propionyl group, butylyl group, isobutylyl group, vareryl group, isovareyl group, and benzoyl group.

The above-mentioned monovalent hydrocarbon groups, organoxy groups, organoamino groups, organosilyl groups, organothio groups, and acyl groups are not specifically restricted in the number of carbon atoms. Their carbon number is usually 1 to 20, preferably 1 to 8.

The desirable substituent groups are fluorine, sulfonic acid group, substituted or unsubstituted organoxy group, alkyl group, and organosilyl group. These substituent groups should preferably be absent for better charge-transporting performance.

According to the present invention, the charge-transporting substance composed of charge-transporting oligomer or polymer should have a number-average molecular weight of 200 to 500,000. Under the lower limit, it will be poor in charge-transporting performance due to excessive volatility. Over the upper limit, it will be unusable due to excessively low solubility in solvents.

Its number-average molecular weight should preferably be no higher than 5000, more preferably no higher than 2000 from the standpoint of its good solubility in solvents. For charge-transporting substances having a number-average molecular weight of 5000 to 500,000, it is desirable to use at least one species of highly dissolving solvents (mentioned later) in order to raise their solubility. The highly dissolving solvents may be properly selected according to the charge-transporting substance to be used. The oligomer or polymer should preferably be one which has no molecular weight distribution from the standpoint of good solubility and uniform charge-transporting performance.

Incidentally, the number-average molecular weight is measured by gel permeation chromatography (in terms of polystyrene).

The charge-transporting substance should preferably be an oligoaniline derivative represented by the formula (1) or a quinonediimine derivative in its oxidized form, which has high solubility, good charge-transporting performance, and adequate ionization potential. The oligoaniline derivative should preferably undergo reduction with hydrazine.

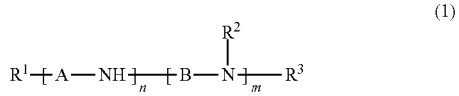

(where $R^1$, $R^2$; and $R^3$ independently denote hydrogen, hydroxyl group, halogen group, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group, and A and B independently denote a divalent group represented by the formula (2) or (3) below.

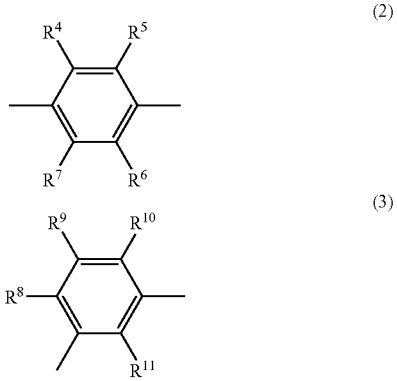

(where $R^4$ to $R^{11}$ independently denote hydrogen, hydroxyl group, halogen group, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group, and m and n independently denote an integer of 1 and above, such that $m+n \leq 20$.) The substituent groups represented by $R^1$ to $R^{11}$ may be the same ones as those in the conjugated units mentioned above. These substituent groups may have any other arbitrary substituent groups.

The oligoaniline derivative is exemplified by phenyl tetraaniline, pentaphenyl aniline, tetraaniline(aniline tetramer), octaaniline(aniline octamer), hexadecaaniline(aniline hexadecamer), (phenyltolylanilino)triphenylamine, (phenyltrianilino)triphenylamine, (phenyltrianilino)diphenyloctylamine, hexadeca-o-phenetidine(o-phenetidine hexadecamer), aminotetraaniline, phenyltetraanilinesulfonic acid (having 1 to 4 sulfonic acid groups), and (butylphenyl)tetraaniline. They are all soluble in organic solvents.

Incidentally, these oligoaniline derivatives may be synthesized by any process which is not specifically restricted. Typical processes are disclosed in Bulletin of Chemical Society of Japan, 1994, vol. 67, pp. 1749-1752, and Synthetic Metals, US, 1997, vol. 84, pp. 119-120.

Another adequate charge-transporting substance is a 1,4-dithiin derivative represented by the formula (4).

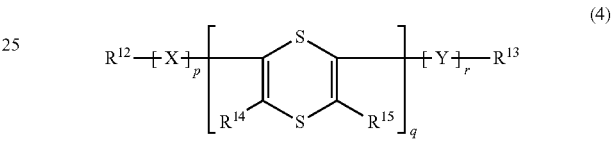

(where $R^{12}$, $R^{13}$, $R^{14}$, and $R^{15}$ independently denote hydrogen, hydroxyl group, halogen group, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group; X and Y each denote at least one species selected from substituted or unsubstituted, di- to tetra-valent aniline, thiophene, furan, pyrrole, ethynylene, vinylene, phenylene, naphthalene, anthracene, imidazole, oxazole, oxadiazole, quinoline, quinoxaline, silole, silicon, pyridine, pyrimidine, pyrazine, phenylenevinylene, fluorene, carbazole, triarylamine, metal-containing or metal-free phthalocyanine, and metal-containing or metal-free porphyrin; the dithiin ring may be dithiinoxide ring or dithiindioxide ring; and p, q, and r independently denote 0 or an integer of 1 and above, such that $p+q+r \leq 20$.)

The substituent groups represented by $R^{12}$ to $R^{15}$ may be the same ones as those in the conjugated units mentioned above. These substituent groups may have any other arbitrary substituent groups. X and Y are the same units as the conjugated units mentioned above. These conjugated units may also have the above-mentioned substituent groups.

The dithiin derivative mentioned above is exemplified by 2,6-bis(2,2'-bithiophenyl)-1,4-dithiin, 2,6-bis(2,2'-terthiophenyl)-1,4-dithiin, 2,6-bis(2,2'-biphenyl)-1,4-dithiin, 2,6-bis(2,2'-binaphthyl)-1,4-dithiin, and 2,6-bis(2,2'-bifuryl)-1,4-dithiin. Additional examples include oligothiophene derivatives such as α-ethylthienyl and 2,2':5',2"-terthiophene-5,5"-dialdehyde (which are soluble in organic solvents).

Incidentally, these oligothiophene derivatives may be synthesized by any process which is not specifically restricted. Typical processes are disclosed in Heterocycles, 1987, vol. 26, pp. 939-942, and Heterocycles, 1987, vol. 26, pp. 1793-1796.

Other suitable charge-transporting substances are exemplified by charge-transporting oligomers such as oligovinylene derivatives (which include β-carotene, lycopene, canthaxanthine, xanthphyll, astaxanthine, and bixin) and charge-transporting monomers such as metal-containing and metal-free phthalocyanine (which include copper(II) 2,3,9,10,16,17,23,24-octakis(octhyroxy)-29H,31H-phthalocyanine, zinc(II) 2,3,8,10,16,17,23,24-octakis(octhyroxy)-29H, 31H-phthalocyanine, nickel(II) 2,3,9,10,16,17,23,24-octakis(octhyroxy)-29H,31H-phthalocyanine, and 1,4,8,11,15,18,22,25-octabutoxy-29H,31H-phthalocyanine).

The charge-transporting vanish according to the present invention may be prepared from the charge-transporting substance alone or from a charge-transporting organic material which is composed of the charge-transporting substance and a charge-accepting dopant substance.

Here, the charge-accepting dopant substance is an electron accepting dopant substance for the hole transporting substance or a hole accepting dopant substance for the electron transporting substance. Both should have a high charge-accepting capacity. The charge-transporting substance is not specifically restricted in solubility so long as it is soluble in at least one kind of solvent used for the vanish.

The electron accepting dopant substance is exemplified by inorganic strong acids, such as hydrogen chloride, sulfuric acid, nitric acid, and phosphoric acid; Lewis acids, such as aluminum (III) chloride ($AlCl_3$), titanium (IV) tetrachloride ($TiCl_4$), boron trichloride ($BBr_3$), boron trifluoride-ether complex ($BF_3.OEt_2$), iron (III) chloride ($FeCl_3$), copper (II) chloride ($CuCl_2$), antimony (V) pentachloride ($SbCl_5$), arsenic (V) pentafluoride ($AsF_5$), phosphorus pentafluoride ($PF_5$), and tris(4-bromophenyl)aluminum hexachloroantimonite (TBPAH); organic strong acids, such as benzenesulfonic acid, tosylic acid, camphasulfonic acid, hydroxybenzenesulfonic acid, 5-sulfosalicylic acid, dodecylbenzenesulfonic acid, and polystyrenesulfonic acid, and organic or inorganic oxidants, such as 7,7,8,8-tetracyanoquinodimethane (TCNQ), 2,3-dichloro-5,6-dicyano-1,4-benzoquinone (DDQ), and iodine. These examples are not limitative.

The hole accepting dopant substance is exemplified by alkali metals, such as Li, Na, K, and Cs, and metal complexes, such as lithium quinolinolate (Liq) and lithium acetylacetonate (Li(acac)). These examples are not limitative.

According to the present invention, both the charge-transporting substance and the charge-accepting dopant substance should preferably be amorphous solid. If either of them is required to be crystalline solid, it should desirably be a material which exhibits amorphous solid properties when a film is formed from the varnish composed of the charge-transporting substance, the charge-accepting dopant substance, and the solvent containing a high-viscosity solvent (which will be mentioned later).

Particularly in the case where at least either of the charge-transporting substance or charge-accepting dopant substance is crystalline solid, it should desirably be a substance which exhibits random intermolecular mutual actions. In the case where the charge accepting dopant is a low-molecular-weight compound, it should desirably be a compound which has three or more different polar functional groups in the same molecule.

These compounds are not specifically restricted; they include, for example, Tiron, dihydroxybenzenesulfonic acid, and sulfonic acid derivatives represented by the formula (5). The last one is most desirable. A typical example of the sulfonic acid derivatives is a sulfosalicylic acid derivative, such as 5-sulfosalicylic acid.

(where D denotes a benzene ring, naphthalene ring, anthracene ring, phenanthrene ring, or heterocyclic ring; and $R^{16}$ and $R^{17}$ independently denote a carboxyl group or hydroxyl group.)

The charge-transporting varnish according to the present invention is prepared with a solvent which contains at least one species of high-viscosity organic solvent having a viscosity of 10 to 200 mPa·s at 20° C. and a boiling point of 50 to 300° C. at normal pressure. This solvent should preferably be an organic solvent having a viscosity of 50 to 150 mPa·s at 20° C. and a boiling point of 150 to 250° C. at normal pressure. Moreover, this high-viscosity solvent should preferably be neutral so that it does not affect the oxidizing and reducing actions of the charge-transporting substance and the charge-accepting dopant substance. The value of viscosity is obtained by measurement with an E-type viscometer (ELD-50, made by Tokyo Keiki).

They are exemplified by cyclohexanol, ethyleneglycol, ethyleneglycol diglycidyl ether, 1,3-octyleneglycol, diethyleneglycol, dipropyleneglycol, triethyleneglycol, tripropyleneglycol, 1,3-butanediol, 1,4-butanediol, propyleneglycol, and hexyleneglycol. They are not limitative. Of these examples, cyclohexanol and dipropyleneglycol are preferable because of their adequate viscosity and boiling point and good coating performance on the substrate.

According to the present invention, the high-viscosity solvent in the charge-transporting varnish should be used in such an amount that it accounts for 10 to 100 wt %, preferably 30 to 90 wt %, more preferably 50 to 80 wt %, in the total amount of the solvent in the varnish. The ratio of the high-viscosity solvent should be 50 to 80 wt % so long as no solids separate out.

The charge-transporting varnish may contain a solvent which readily dissolves the charge transporting substance and the charge accepting dopant substance. This high-solvency solvent permits the charge-transporting substance to dissolve or uniform disperse in the varnish despite its low viscosity. The mixing ratio of the high-viscosity solvent to the high-solvency solvent is not specifically restricted. It is usually from 99:1 to 10:90, preferably from 90:10 to 30:70, and more preferably from 80:20 to 50:50 (by mass).

The high-solvency solvent is exemplified by water, methanol, N,N-dimethylformamide, N,N-dimethylacetamide, N-methylpyrrolidone, N-methylformanilide, N,N'-dimethylimidazolidinone, dimethylsulfoxide, chloroform, toluene, and methanol. They are not limitative.

The charge-transporting varnish may optionally contain a solvent which improves the varnish in wettability on the substrate, adjusts the surface tension, polarity, and boiling point of the solvent, and makes the film flat at the time of baking. The ratio of the optional solvent to the total amount of solvents in the varnish is 1 to 90 wt %, preferably 1 to 50 wt %.

The optional solvent may be exemplified by butyl cellosolve, diethyleneglycol diethyl ether, dipropyleneglycol monomethyl ether, ethyl carbitol, diacetone alcohol, γ-butyrolactone, and ethyl lactate. They are not limitative.

Incidentally, the charge-transporting varnish according to the present invention may vary in viscosity ranging from 1 to 60 mPa·s depending on the composition and ratio of solvents.

According to the present invention, the charge-transporting thin film is prepared from the charge-transporting varnish mentioned above. It is suitable for use as the hole injection layer (hole transporting layer) or the electron injection layer (electron transporting layer) of an organic EL element.

The thin film may be formed by applying the charge-transporting varnish onto a substrate, which is followed by solvent evaporation. The method for varnish application is not specifically restricted; it includes dipping, spin coating, transfer printing, roll coating, ink-jet, spraying, and brushing, which are capable of uniform film formation.

The method for solvent evaporation is not specifically restricted; it includes heating with a hot plate or oven under an adequate atmosphere, such as air, inert gas (nitrogen), and vacuum. The baking temperature is not specifically restricted so long as it is high enough for solvent evaporation; it is usually 40 to 250° C. For better film uniformity or for reaction on the substrate, baking may be accomplished in two or more stages at different temperatures.

The thickness of the charge-transporting thin film is not specifically restricted. It should preferably be 5 to 200 nm if it is used as the charge injection layer in an organic EL element. The film thickness may be adjusted by changing the solid content in the varnish or by changing the amount of the solution applied onto the substrate.

The charge-transporting varnish (or the charge-transporting thin film prepared therefrom) according to the present invention may be used to form the OLED element in the following manner, which is not limitative.

The first step starts with cleaning the substrate (as the electrode) with detergent, alcohol, or pure water. The anode substrate should preferably undergo surface treatment (such as ozone treatment and oxygen-plasma treatment) immediately before use. However, this surface treatment may be omitted if the anode substrate is composed mainly of organic materials.

In the case where the hole transporting varnish is used for the OLED element, the thin film may be formed in the following manner.

The hole transporting varnish is applied to the anode substrate by the above-mentioned coating method in order to form the hole transporting thin film on the electrode. The coated electrode is placed in a vacuum deposition chamber so that it is coated sequentially with hole transporting layer, emitting layer, electron transporting layer, electron injection layer, and cathode metal layer by vacuum deposition. In this way the desired OLED element is obtained. Incidentally, a carrier block layer may be formed between any adjacent layers in order to control the emitting region.

The anode is a transparent electrode represented one formed from indium tin oxide (ITO) or indium zinc oxide (IZO). It should preferably be planarized after deposition. These materials may be replaced by a polythiophene derivative or polyaniline which exhibits high charge-transporting performance.

The hole transporting layer may be formed from any of the following materials. Triarylamines, such as (tirphenylamine) dimer derivative (TPD), (α-naphthyldiphenylamine)dimer (α-NPD), and [(triphenylamine)dimer]spirodimer (Sprio-TAD); starburst amines, such as 4,4',4"-tris[3-methylphenyl (phenyl)amino]triphenylamine(m-MTDATA), and 4,4',4"-tris(1-naphthyl(phenyl)amino)triphenylamine(1-TNATA), and oligothiophenes, such as 5,5"-bis-{4-[bis(4-methylphenyl)amino])}phenyl-2,2':5',2"-terthiophene (BMA-3T).

The emitting layer may be formed from any of tris(8-quinolinolate)aluminum (III) ($Alq_3$), bis(8-quinolinolate) zinc (II) ($Znq_2$), bis(2-methyl-8-quinolinolate)(p-phenylphenolate)aluminum (III) (BAlq), and 4,4'-bis(2,2-diphenylvinyl)biphenyl (DPVBi). The emitting layer may also be formed by co-deposition with the electron-transporting material or hole-transporting material and the emitting dopant.

The electron-transporting material includes $Alq_3$, BAlq, DPVBi, (2-(4-biphenyl)-5-(4-t-butylphenyl)-1,3,4-oxadiazole) (PBD), triazole derivative (TAZ), bathocuproin, and silole derivatives.

The emitting dopant includes quinacridone, rubrene, coumarin 540, 4-(dicyanomethylene)-2-methyl-6-(p-dimethylaminostyryl)-4H-pyran (DCM), tris(2-phenylpyridine)iridium (III) ($Ir(ppy)_3$), and (1,10-phenathroline)-tris(4,4,4-trifluoro-1-(2-thienyl)-butane-1,3-dionate)europium (III) ($Eu(TTA)_3phen$).

The carrier block layer may be formed from any of PBD, TAZ, and BCP.

The electron injection layer may be formed from any of lithium oxide ($Li_2O$), magnesium oxide (MgO), alumina ($Al_2O_3$), lithium fluoride (LiF), magnesium fluoride ($MgF_2$), strontium fluoride ($SrF_2$), Liq, Li(acac), lithium acetate, and lithium benzoate.

The cathode may be formed from any of aluminum, magnesium-silver alloy, aluminum-lithium alloy, lithium, sodium, potassium, and cesium.

For application to the OLED element, the electron-transporting varnish may be formed into thin film in the following manner.

The cathode substrate is coated with the electron-transporting varnish in order to form the electron-transporting thin film. The coated substrate is placed in a vacuum deposition chamber so that it is coated sequentially with electron transporting layer, emitting layer, hole transporting layer, hole injection layer, and anode metal layer by sputtering from the above-mentioned materials. In this way the desired OLED element is obtained.

The charge-transporting varnish according to the present invention may be used to prepare the PLED element by any process which is not specifically restricted. A typical process is given below.

The process involves formation of an emitting charge-transporting polymeric layer in place of the hole transporting layer, emitting layer, electron transporting layer, and electron injection layer, which are formed by vacuum deposition for the OLED element. The resulting PLED element contains the charge-transporting thin film formed from the charge-transporting varnish of the present invention.

To be concrete, the process for preparing the PLED element consists of forming the hole transporting thin film on the anode substrate (in the same way as in the case of OLED element) from the hole transporting varnish, forming thereon the emitting charge-transporting polymeric layer, and further depositing thereon the cathode electrode. In this way the desired PLED element is obtained.

An alternative process consists of forming the electron transporting thin film on the cathode substrate (in the same way as in the case of OLED element) from the electron transporting varnish, forming thereon the emitting charge-transporting polymeric layer, and forming the anode electrode by sputtering, vapor deposition or spin coating. In this way the desired PLED element is obtained.

The cathode and anode may be formed from the same material as used for the OLED element. They should undergo cleaning and surface treatment in the same way as mentioned above.

The emitting charge-transporting polymeric layer may be formed in the following way. The emitting charge-transporting polymeric material (with or without the emitting dopant) is dissolved or uniformly dispersed in a solvent. The resulting solution is applied to the electrode substrate on which the hole injection layer has been formed. The solvent is removed by evaporation.

The emitting charge-transporting polymeric material includes the following. Polyfluorene derivatives, such as poly (9,9-dialkylfluorene) (PDAF); polyphenylenevinylene derivatives, such as poly(2-methoxy-5-(2'-ethylhexoxy)-1,4-phenylenevinylene) (MEH-PPV); polythiophene derivatives, such as poly(3-alkylthiophene) (PAT); and polyvinylcarbazole (PVCZ).

The solvent includes toluene, xylene, chloroform, and the like. Dissolution or uniform dispersion may be accomplished by stirring, stirring with heating, or ultrasonic dispersion.

The coating method is not specifically restricted; it includes dipping, spin coating, transfer printing, roll coating, ink-jet, spraying, and brushing. Coating should preferably be carried out in an inert gas atmosphere, such as nitrogen and argon.

Solvent removal may be accomplished by heating with a hot plate or oven under an inert gas atmosphere or vacuum.

EXAMPLE

The invention will be explained in more detail with reference to the following examples, which are not intended to restrict the scope thereof.

Physical data in Examples and Comparative Examples were measured in the following manner.

Viscosity: measured with an E-type viscometer (ELD-50), made by Tokyo Keiki Co., Ltd.
Film thickness: measured with a surface profiler (DEKTAK3ST), made by Nippon Shinkuu Gijutsu Co., Ltd.
Surface roughness: measured with an atomic force microscope (AFM), "Nanoscope"™ IIIa, made by Japan Veeco Co., Ltd.
Current: measured with a digital multimeter 7555, made by Yokogawa Denki Co., Ltd.
Voltage was generated by using a DC voltage current source R6145, made by Advantest Co., Ltd.
Luminance: measured with a luminance meter, BM-8, made by Topcon Co., Ltd.
Ionization potential: measured with a photoelectron spectrometer, AC-2, made by Riken Keiki Co., Ltd.

Example 1

Phenyltetraaniline (PTA) was prepared as follows according to the process mentioned in Bulletin of Chemical Society of Japan, 1994, vol. 67, pp. 1749-1752.

In 2 liters of toluene was dissolved 12.977 g of p-phenylenediamine. The resulting solution was given 245.05 g of tetra-n-butoxytitanium (as a dehydration-condensation agent), which was dissolved at 70° C. for 30 minutes. With 53.346 of p-hydroxydiphenylamine added, reaction was carried out at 100° C. for 24 hours under a nitrogen stream. After reaction was complete, the reaction mixture was filtered and remaining solids were washed sequentially with toluene and ether. After drying, slivery crystals were obtained. One part by weight of the crystals was placed in 25 parts by weight of dioxane together with 0.2 equivalent of hydrazine hydrate. With the atmosphere in the reaction system replaced with nitrogen, the crystals were dissolved by refluxing.

To the resulting solution was added toluene (in an amount of 25 parts by weight for 1 part by weight of the crystals) so that the suspended solution was prepared. After refluxing the suspended solution, 10 parts by weight of dioxane was further added, and the crystals in the suspension was dissolved by further refluxing. The resulting solution was filtered while hot. The filtrate was allowed to cool for precipitation of solids. The resulting solids were recrystallized, and the resulting crystals were washed sequentially with toluene-dioxane mixture (1:1) and ether under a nitrogen atmosphere. The thus obtained crystals were dried at 60° C. for 10 hours under reduced pressure. Recrystallization was repeated in the same way as above to give 39.60 g of white crystals (in a 75% yields).

The thus obtained PTA in an amount of 1.000 g (2.260 mmol) was given 2.298 g (9.039 mmol) of 5-sulfosalicylic acid dehydrate (5-SSA for short hereinafter) and 17.50 g of N,N-dimethylacetamide (DMAc) under a nitrogen atmosphere. The resulting solution was stirred with 52.50 g of cyclohexanol (c-HexOH, with a viscosity of 68 mPa·s at 20° C.) as a high-viscosity solvent, in order to prepare a varnish (containing 4.2 wt % solids). Table 1 shows the appearance, viscosity, and film-forming conditions of the varnish.

The varnish was applied by spin coating to an ITO glass substrate which had been cleaned with ozone for 40 minutes. Coating was followed by baking at 180° C. for 2 hours under the air to give a uniform thin film. The resulting thin film has the film thickness, conductivity, and surface roughness as shown in Table 2.

A hole-transporting thin film was formed on an ITO glass substrate from the above-mentioned varnish in the same way as above. The coated substrate was placed in a vacuum deposition chamber, and it was coated sequentially with α-NPD (40 nm thick), $Alq_3$ (60 nm thick), LiF (0.5 nm thick), and Al (100 nm thick). Deposition was carried out at a pressure below $8 \times 10^{-4}$ Pa. The rate of deposition (except for LiF) was adjusted to 0.3 to 0.4 nm/s. The rate of deposition for LiF was adjusted to 0.02 to 0.04 nm/s. Transfer from one stage of deposition to another was carried out in a vacuum. The resulting OLED element has the characteristic properties as shown in Table 3.

Comparative Example 1

PTA was prepared by synthesis and purification in the same way as in Example 1, and 1.000 g (2.260 mmol) of PTA, together with 2.298 g (9.039 mmol) of 5-SSA, were dissolved in 70 g of N,N-dimethylformamide (DMF) under a nitrogen atmosphere to give a varnish. The resulting varnish was applied to an ITO glass substrate in the same way as in Example 1 to form a thin film thereon.

Table 1 shows the appearance, viscosity, and film-forming conditions of the varnish. Table 2 shows the thickness and surface roughness of the thin film.

It is noted from Table 1 that the varnish in Comparative Example 1 is less viscous than that in Example 1. It is also noted that the thin film formed from the varnish in Comparative Example 1 has a rougher surface than that formed from the varnish in Example 1.

Comparative Example 2

PTA was prepared by synthesis and purification in the same way as in Example 1, and 1.000 g (2.260 mmol) of PTA, together with 2.298 g (9.039 mmol) of 5-SSA, were dissolved in 70 g of DMAc under a nitrogen atmosphere to give a varnish. Table 1 shows the appearance, viscosity, and film-forming conditions of the varnish.

It is noted from Table 1 that the varnish in Comparative Example 2 is less viscous than that in Example 1.

Comparative Example 3

An ITO glass substrate was treated in the same way as in Example 1. The treated ITO substrate was placed in a vacuum deposition chamber, and it was coated sequentially with α-NPD, Alq₃, LiF, and Al in the same way as in Example 1. Table 2 shows the surface roughness of the treated ITO glass substrate. Table 3 shows the characteristic properties of the OLED element.

It is noted from Table 2 that the ITO glass substrate without the thin film of the varnish of the present invention has a considerable surface roughness. It is noted from Table 3 that the OLED element in Comparative Example 3 is inferior to that in Example 1 in voltage, luminance, and current efficiency at a current density of 10 mA/cm². It is also noted from Table 3 that the OLED element in Comparative Example 3 is inferior to that in Example 1 in current density, luminance, and current efficiency at a voltage of 7.0 V.

Comparative Example 4

An ITO glass substrate was treated in the same way as in Example 1. The treated ITO substrate was coated by spin coating with an aqueous solution of polyethylene dioxythiophene-polystyrene sulfonic acid. Coating was followed by baking at 120° C. for 1 hour under the air to give a uniform thin film. Table 2 shows the thickness, conductivity, and surface roughness of the thin film.

It is noted from Table 2 that the thin film in Comparative Example 4 has a lower conductivity and a rougher surface than that prepared from the varnish in Example 1.

The ITO glass substrate was coated with a hole-transporting thin film in the same way as in Example 1, and an OLED element was prepared in the same way as in Example 1. Table 3 shows the characteristic properties of the OLED element.

It is noted from Table 3 that the OLED element in Comparative Example 4 is inferior to that in Example 1 in voltage, luminance, and current efficiency at a current density of 10 mA/cm². It is also noted from Table 3 that the OLED element in Comparative Example 4 is inferior to that in Example 1 in current density, luminance, and current efficiency at a voltage of 7.0 V.

Example 2

Four kinds of varnishes were prepared as follows from PTA (which had been synthesized and purified by the process mentioned in Example 1) and 5-SSA in the same way as in Example 1 (with their molar ratio remaining unchanged at 1:4 and the solids content remaining unchanged at 4.2 wt %), except that the solvent composition and ratio were changed.

That is, PTA and 5-SSA were dissolved in DMAc under a nitrogen atmosphere. The resulting solution was incorporated with c-HexOH, or dipropyleneglycol (DPG for short hereinafter), or DPG plus BC (as the high-viscosity solvent). All of the resulting varnishes were complete solutions free of solids precipitation.

Table 1 shows the appearance, viscosity, and film-forming conditions of the varnish. It is noted from Table 1 that the viscosity of the varnish ranges from 1.4 to 58 mPa·s depending on the solvent composition and mixing ratio.

The thus obtained varnishes were used to prepare OLED elements in the same way as in Example 1. The resulting OLED elements have the same characteristic properties as that in Example 1.

Example 3

One of the varnishes in Example 2, which was dissolved in a mixed solvent of DPG-DMAc-BC (6:3:1), was formed into a thin film by off-set printing method under the condition shown in Table 1. An OLED element with this thin film was prepared. Table 3 shows the characteristic properties of the resulting OLED.

Example 4

Aniline hexadecamer (Ani16) was prepared as follows according to the process mentioned in Synthetic Metals, 1997, vol. 84, pp. 119-120. In 35.00 g of N,N-dimethylacetamide (DMAc) were dissolved 1.000 g of Ani16, together with 2.786 g of 5-sulfosalicylic acid under a nitrogen atmosphere. The resulting solution was stirred with 105.00 g of cyclohexanol (c-HexOH), as a high-viscosity solvent, having a viscosity of 68 mPa·s at 20° C., to give a varnish (which contains 2.36 wt % solids).

Table 1 shows the appearance, viscosity, and film-forming conditions of the varnish. Table 3 shows the characteristic properties of the OLED element prepared with the varnish in the same way as in Example 1.

Example 5

2,6-bis(2,2'-bithiophenyl)-1,4-dithiin (BBD for short hereinafter) represented by the formula below was synthesized as follows according to the process mentioned in Heterocycles, 1997, vol. 26, pp. 939-942.

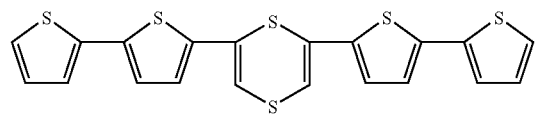

In 97.87 g of N,N-dimethylacetamide (DMAc) was dissolved 1.000 g of BBD, together with 1.142 g of 5-sulfosalicylic acid, under the air. The resulting solution was stirred with 48.94 g of cyclohexanol as a high-viscosity solvent to give a varnish (which contains 1.2 wt % solids).

Table 1 shows the appearance, viscosity, and film-forming conditions of the varnish. Table 3 shows the characteristic properties of the OLED element prepared with the varnish in the same way as in Example 1.

Example 6

A mixture of 1.000 g of BBD (obtained in Example 5) and 1.142 g of 5-SSA was dissolved in 17.50 g of DMAc with stirring at 60° C. for 10 minutes under the air. The resulting solution was stirred with 52.50 g of cyclohexanol to give a varnish containing 2.8 wt % solids. The thus obtained varnish gave no precipitation when cooled to room temperature. Table 1 shows the appearance, viscosity, and film-forming conditions of the varnish. The varnish gave a flawless uniform thin film when processed in the same way as in Example 1. The resulting thin film was found to have an ionization potential value of 5.5 eV.

Comparative Example 5

A mixture of 1.000 g of BBD (obtained in Example 5) and 2.285 g of 5-SSA was dissolved in 140 g of DMF with stirring at room temperature under the air to prepare a varnish containing 1.4 wt % solids. Table 1 shows the appearance, viscosity, and film-forming conditions of the varnish. The varnish did not give a uniform thin film when processed in the same way as in Example 1. The resulting thin film has radial irregularities that occur at the time of spin coating.

Example 7

A mixture of PTA (obtained in Example 1) and 5-SSA in different ratios was dissolved in any of solvents listed in Table 4 to give five kinds of varnishes. The resulting varnishes were complete solutions free of precipitation. Table 4 shows the amount of PTA and 5-SSA and the solids content, viscosity, and film-forming conditions of each varnish.

Table 5 shows the characteristic properties of the OLED element prepared with the varnish in the same way as in Example 1. It also shows the characteristic properties of the PLED element prepared in the following manner.

Preparation of PLED Element

The varnish mentioned above was applied to the ITO glass substrate in the same way as mentioned in Example 1. The varnish film was further coated by spin coating with a toluene solution of MEH-PPV (with a solids content of 10 g/L) under a nitrogen atmosphere. The coating process was followed by baking at 110° C. for 20 minutes to give an emitting layer (80 nm thick). The coated substrate was placed in a vapor deposition chamber, and it was coated sequentially with Ca (20 nm thick) and Al (100 nm thick) by deposition to give the desired PLED element.

TABLE 1

|  | Solvent | Appearance | Viscosity of Varnish (mPa·s) | Film Forming Conditions |
| --- | --- | --- | --- | --- |
| Example 1 | c-HexOH-DMAc (3:1) | Green, clear solution | 12 | 180° C., 2 h |
| Comparative Example 1 | DMF | Light green, clear solution | 1.4 | 180° C., 2 h |
| Comparative Example 2 | DMAc | Light green, clear solution | 1.6 | 180° C., 2 h |
| Example 2 (1) | c-HexOH-DMAc (5:1) | Green, clear solution | 15 | 180° C., 2 h |
| Example 2 (2) | c-HexOH-DMAc (9:1) | Green, clear solution | 21 | 180° C., 2 h |
| Example 2 (3) | DPG-DMAc (9:1) | Green, clear solution | 58 | 180° C., 2 h |
| Example 2 (4) | DPG-DMAc-BC (6:3:1) | Green, clear solution | 16 | 80° C., 5 min to 180° C., 2 h |
| Example 4 | c-HexOH-DMAc (3:1) | Dark green, clear solution | 12 | 180° C., 2 h |
| Example 5 | c-HexOH-DMAc (1:2) | Reddish orange, clear solution | 3.5 | 180° C. 30 min |
| Example 6 | c-HexOH-DMAc (3:1) | Reddish orange, clear solution | 12 | 180° C. 30 min |
| Comparative Example 5 | DMF | Reddish orange, clear solution | 1.4 | 180° C. 30 min |

TABLE 2

|  | Film Thickness (nm) | Conductivity (S/cm) at 100 mA/cm$^2$ | Surface Roughness | | |
| --- | --- | --- | --- | --- | --- |
|  |  |  | Standard Deviation Rms (nm) | Average Roughness Ra (nm) | Maximum Height Rmax (nm) |
| Example 1 | 21 | — | 0.16 | 0.56 | 0.72 |
| Example 1 | 66 | — | 0.09 | 0.31 | 0.45 |
| Example 1 | 58 | $3.5 \times 10^{-7}$ | — | — | — |
| Comparative Example 1 | 15 | — | 0.53 | 2.76 | 3.08 |
| Comparative Example 3 | 150 | — | 3.31 | 4.29 | 72.43 |
| Comparative Example 4 | 82 | — | 0.43 | 2.23 | 1.69 |
| Comparative Example 4 | 63 | $1.5 \times 10^{-7}$ | — | — | — |

TABLE 3

|  | Film Thickness (nm) | Current Density (mA/cm$^2$) | Voltage (V) | Luminance (cd/m$^2$) | Current Efficiency (cd/A) | Threshold Voltage for Emission (V) | Maximum Luminance (cd/m$^2$) | Ionization Potential (eV) |
| --- | --- | --- | --- | --- | --- | --- | --- | --- |
| Example 1 | 21 | 10 | 8.1 | 410 | 4.1 | 2.75 | 18799 | 5.4 |
|  | 21 | 2.86 | 7.0 | 101 | 3.5 | 2.75 | 18799 | 5.4 |
| Example 3 | 25 | 10 | 8.2 | 395 | 4.0 | 2.75 | 19680 | 5.4 |
|  | 25 | 2.75 | 7.0 | 96 | 3.5 | 2.75 | 19680 | 5.4 |
| Example 4 | 28 | 10 | 7.5 | 310 | 3.1 | 2.75 | 11730 | 5.5 |
|  | 18 | 5.69 | 7.0 | 169 | 3.0 | 2.75 | 11730 | 5.5 |
| Example 5 | 10 | 10 | 7.3 | 709 | 3.3 | 2.75 | 18270 | 5.5 |
|  | 10 | 9.38 | 7.0 | 309 | 3.3 | 2.75 | 18270 | 5.5 |

TABLE 3-continued

|  | Film Thickness (nm) | Current Density (mA/cm$^2$) | Voltage (V) | Luminance (cd/m$^2$) | Current Efficiency (cd/A) | Threshold Voltage for Emission (V) | Maximum Luminance (cd/m$^2$) | Ionization Potential (eV) |
|---|---|---|---|---|---|---|---|---|
| Comparative Example 3 | — | 10 | 9.2 | 330 | 3.3 | 4.50 | 10640 | 5.1 |
|  | — | 0.37 | 7.0 | 1.2 | 0.3 | 4.50 | 10640 | 5.1 |
| Comparative Example 4 | 42 | 10 | 6.9 | 230 | 2.3 | 2.75 | 5610 | 5.6 |
|  | 42 | 11.4 | 7.0 | 253 | 2.2 | 2.75 | 5610 | 5.6 |

TABLE 4

|  | Amount of PTA (g) | Amount of SSA (g) | Solids Concentration (wt %) | Viscosity (mPa · s) | Film Forming Conditions |
|---|---|---|---|---|---|
| Example 7 (1) | 1.000 | 1.149 | 2.8 | 12 | 180° C., 2 h |
| Example 7 (2) | 1.000 | 2.298 | 4.2 | 12 | 180° C., 2 h |
| Example 7 (3) | 1.000 | 4.596 | 6.6 | 12 | 180° C., 2 h |
| Example 7 (4) | 1.000 | 6.900 | 5.0 | 12 | 180° C., 2 h |
| Example 7 (5) | 1.000 | 9.200 | 7.0 | 12 | 180° C., 2 h |

TABLE 5

|  | Film Thickness (nm) | Current Density (mA/cm$^2$) | Voltage (V) | Luminance (cd/m$^2$) | Current Efficiency (cd/A) | Threshold Voltage for Emission (V) | Maximum Luminance (cd/m$^2$) | Ionization Potential (eV) |
|---|---|---|---|---|---|---|---|---|
| Example 7 (1) OLED | 59 | 11.6 | 7.0 | 433 | 3.7 | 2.75 | 17970 | 5.3 |
|  | 59 | 10 | 6.9 | 365 | 3.7 | 2.75 | 17970 | 5.3 |
| Example 7 (1) PLED | 50 | 114 | 7.0 | 465 | 0.41 | 2.5 | 2620 | 5.3 |
|  | 50 | 500 | 9.5 | 2150 | 0.43 | 2.5 | 2620 | 5.3 |
| Example 7 (2) PLED | 50 | 203 | 7.0 | 920 | 0.45 | 2.5 | 2980 | 5.4 |
|  | 50 | 500 | 9.0 | 2000 | 0.40 | 2.5 | 2980 | 5.4 |
| Example 7 (3) OLED | 50 | 0.61 | 7.0 | 13 | 2.0 | 3.0 | 4570 | 5.4 |
|  | 50 | 10 | 10.9 | 245 | 2.5 | 3.0 | 4570 | 5.4 |
| Example 7 (3) PLED | 50 | 352 | 7.0 | 2280 | 0.64 | 2.5 | 3000 | 5.4 |
|  | 50 | 500 | 7.5 | 2850 | 0.57 | 2.5 | 3000 | 5.4 |
| Example 7 (4) OLED | 50 | 0.78 | 7.0 | 16 | 2.1 | 3.0 | 3400 | 5.5 |
|  | 50 | 10 | 10.5 | 258 | 2.6 | 3.0 | 3400 | 5.5 |
| Example 7 (4) PLED | 50 | 662 | 7.0 | 3330 | 0.50 | 2.5 | 2810 | 5.6 |
|  | 50 | 500 | 6.5 | 2850 | 0.57 | 2.5 | 2810 | 5.6 |
| Example 7 (5) PLED | 50 | 42 | 7.0 | 1626 | 0.39 | 2.5 | 1910 | 5.6 |
|  | 50 | 500 | 7.5 | 1600 | 0.32 | 2.5 | 1910 | 5.6 |

It has been mentioned above that the charge-transporting varnish according to the present invention provides a charge-transporting thin film which is flat and highly uniform. The charge-transporting thin film formed on the electrode surface makes the electrode surface flat and homogenous, thereby preventing electric shortage. The varnish has a viscosity which readily changes according as the ratio of solvents changes. The vanish is also variable in baking temperature and applicable to various coating processes depending on the kind of solvents added. In other words, the charge-transporting varnish of the present invention can be made into a charge-transporting thin film by a simple inexpensive wet process, such as printing, ink-jet, and spraying. The charge-transporting thin film is used as the charge injection layer for the organic EL elements. The resulting organic EL element can be driven at a low voltage owing to reduction in injection barrier between the electrode and the organic layer. The flat electrode surface and the flat interface between the charge-transporting thin film and the organic layer contribute to the luminous efficiency and to life of the organic EL element. Unlike the conventional charge-transporting varnish of aqueous solution type, the charge-transporting varnish of the present invention is in the form of solution in organic solvents, and hence it prevents entrance of moisture detrimental to the element. The procedure according to the present invention makes it possible to apply conjugated oligomers poor in sublimability and heat resistance to the organic EL elements. According to the present invention, the charge-transporting substance can be easily doped with a charge-accepting dopant substance. The ratio of the charge-accepting dopant may be adequately changed to modify the ionization potential of the thin film and the characteristic properties of the organic EL element. Owing to its high flatness and good processability, the charge-transporting varnish will be applied to capacitor electrode protecting film, antistatic film, and solar cells.

The invention claimed is:

1. A charge-transporting varnish which has a viscosity of 1 to 60 mPa·s at 20° C. and comprises a charge-transporting substance composed of a charge-transporting oligomer having a number-average molecular weight of 200 to 2,000, or a charge-transporting organic material composed of said charge-transporting substance and a charge-accepting dopant substance composed of an electron accepting dopant substance or hole accepting dopant substance, a first solvent containing at least one species of high-viscosity solvent having a viscosity of 10 to 200 mPa·s at 20° C., and one or more second solvents selected from the group consisting of N,N-dimethylacetamide and N,N'-dimethylimidazolidinone, wherein said charge-transporting substance or charge-transporting organic material is dissolved or uniformly dispersed in said solvents, and wherein said charge-transporting substance is a 1,4-dithiin derivative represented by the formula (4):

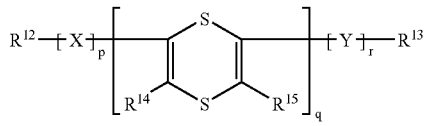
(4)

where $R^{12}$, $R^{13}$, $R^{14}$, and $R^{15}$ independently denote hydrogen, hydroxyl group, halogen, amino group, silanol group, thiol group, carboxyl group, sulfonic acid group, phosphoric acid group, phosphate ester group, ester group, thioester group, amide group, nitro group, monovalent hydrocarbon group, organoxy group, organoamino group, organosilyl group, organothio group, acyl group, or sulfone group; X and Y each denote at least one species selected from substituted or unsubstituted, di- to tetra-valent aniline, thiophene, furan, pyrrole, ethynylene, vinylene, phenylene, naphthalene, anthracene, imidazole, oxazole, oxadiazole, quinoline, quinoxaline, silole, silicon, pyridine, pyrimidine, pyrazine, phenylenevinylene, fluorene, carbazole, triarylamine, metal-containing or metal-free phthalocyanine, and metal-containing or metal-free porphyrin; the dithiin ring may be dithiinoxide ring or dithiindioxide ring; and p and r independently denote an integer of 2 and above, and q denotes an integer of 1 and above, such that p+q+r≤20.

2. A charge-transporting varnish as defined in claim 1, wherein said electron accepting dopant substance is a sulfonic acid derivative represented by the formula (5):

(5)

where D denotes a benzene ring, naphthalene ring, anthracene ring, phenanthrene ring, or heterocyclic ring; and $R^{16}$ and $R^{17}$ independently denote a carboxyl group or hydroxyl group.

3. A method for preparing a charge transporting thin film comprising applying the charge transporting varnish defined in claim 1 to a substrate and evaporating the solvents.

4. A method for preparing an organic electroluminescent element comprising applying the charge transporting varnish defined in claim 1 to a substrate, and evaporating the solvents.

5. The method for preparing an organic electroluminescent element as defined in claim 4, wherein said charge transporting varnish forms a hole injection layer or a hole transporting layer.

6. A charge-transporting varnish as defined in claim 1, wherein said charge-transporting substance and an electron accepting dopant substance or hole accepting dopant substance are amorphous.

7. A charge-transporting varnish as defined in claim 1, wherein said high-viscosity solvent is selected from the group consisting of cyclohexanol, ethyleneglycol, ethyleneglycol diglycidyl ether, 1,3-octyleneglycol, diethyleneglycol, dipropyleneglycol, triethyleneglycol, tripropyleneglycol, 1,3-butanediol, 1,4-butanediol, and hexyleneglycol.

8. A charge-transporting varnish as defined in claim 1, wherein said high-viscosity solvent is selected from the group consisting of cyclohexanol, ethyleneglycol diglycidyl ether, 1,3-octyleneglycol, diethyleneglycol, dipropyleneglycol, tripropyleneglycol, 1,3-butanediol, 1,4-butanediol, and hexyleneglycol.

9. A charge-transporting varnish as defined in claim 1, wherein either of said charge-transporting substance or said charge-accepting dopant substance is amorphous solid.

10. A charge-transporting varnish as defined in claim 1, wherein the mixing ratio of said high-viscosity solvent to said one or more second solvents is from 99:1 to 10:90 by mass.

* * * * *